(12) United States Patent
Kim

(10) Patent No.: US 6,875,647 B2
(45) Date of Patent: Apr. 5, 2005

(54) METHOD OF MANUFACTURING SEMICONDUCTOR DEVICES TO PROTECT AGAINST A PUNCHTHROUGH PHENOMENON

(75) Inventor: Dae-Young Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/634,249

(22) Filed: Aug. 4, 2003

(65) Prior Publication Data

US 2004/0126943 A1 Jul. 1, 2004

(30) Foreign Application Priority Data

Dec. 30, 2002 (KR) ................................ 10-2002-0086172

(51) Int. Cl.[7] .......................................... H01L 21/8238
(52) U.S. Cl. ...................... 438/199; 438/217; 438/302
(58) Field of Search ................................ 438/174, 199, 438/217, 231, 275, 289, 301, 302

(56) References Cited

U.S. PATENT DOCUMENTS 5,216,265 A   6/1993   Anderson et al.
6,008,094 A * 12/1999  Krivokapic et al. ........ 438/286
6,025,224 A   2/2000   Gall et al.
6,030,871 A   2/2000   Eitan
6,211,011 B1  4/2001   Chen
6,238,967 B1  5/2001   Shiho et al.
6,355,954 B1  3/2002   Gall et al.
6,466,489 B1  10/2002  Ieong et al.
6,525,965 B2  2/2003   Ghodsi

FOREIGN PATENT DOCUMENTS

JP    09-97898    4/1997
JP    10-303140   11/1998

* cited by examiner

*Primary Examiner*—Hoai Pham
(74) *Attorney, Agent, or Firm*—Blakely Sokoloff Taylor & Zafman

(57) ABSTRACT

A method of fabricating a semiconductor device includes the step of forming a source and a drain doped with a first conductivity type in an active area, which is made on both sides of a word line by an isolation layer of a second conductivity type doped substrate, each word line being separated by a predetermined interval; forming a first contact and a second contact by using the isolation layer which is separated at a wider interval on the source than on the drain to expose the source and the drain; and selectively implanting the second conductivity type dopant ion in the source by using the isolation layer and the word line as a ion implanting mask during a tilt ion implantation process.

6 Claims, 4 Drawing Sheets

METHOD OF MANUFACTURING SEMICONDUCTOR DEVICES TO PROTECT AGAINST A PUNCHTHROUGH PHENOMENON

FIELD OF INVENTION

The present invention relates to a method of fabricating a semiconductor device; and, more particularly, to a method of fabricating a semiconductor device for effectively protecting a punchthrough phenomenon.

DESCRIPTION OF RELATED ART

According to high integration of a semiconductor device, an occupied area of a transistor is reduced because a cell area is reduced. So, a channel length between source and drain of the transistor becomes shorter. However, a high electric field exists between the source and the drain of the transistor because of reduction of the channel length. This is known as a punchthrough phenomenon, that is, when two depletion areas are joined by a high electric field.

SUMMARY OF INVENTION

For solving the punchthrough problem of the prior art, it is, therefore, an object of the present invention to provide a method of fabricating a semiconductor device for effectively eliminating the punchthrough phenomenon between source and drain of a transistor in a highly integrated semiconductor device.

In accordance with an aspect of the present invention, there is provided a method of fabricating a semiconductor device which includes the step of forming a source and a drain doped with a first conductivity type in an active area, which is made on both sides of a word line by an isolation layer of a second conductivity type doped substrate. Each word line is separated by a predetermined interval. Then, a first contact and a second contact are formed using the isolation layer which is separated at a wider interval on the source than on the drain to expose the source and the drain; and selectively implanting the second conductivity type dopant ion in the source by using the isolation layer and the word line as an ion implanting mask during a tilt ion implantation process.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a method of fabricating a semiconductor device according to the present invention will be described in detail referring to the accompanying drawings.

Figure 1:
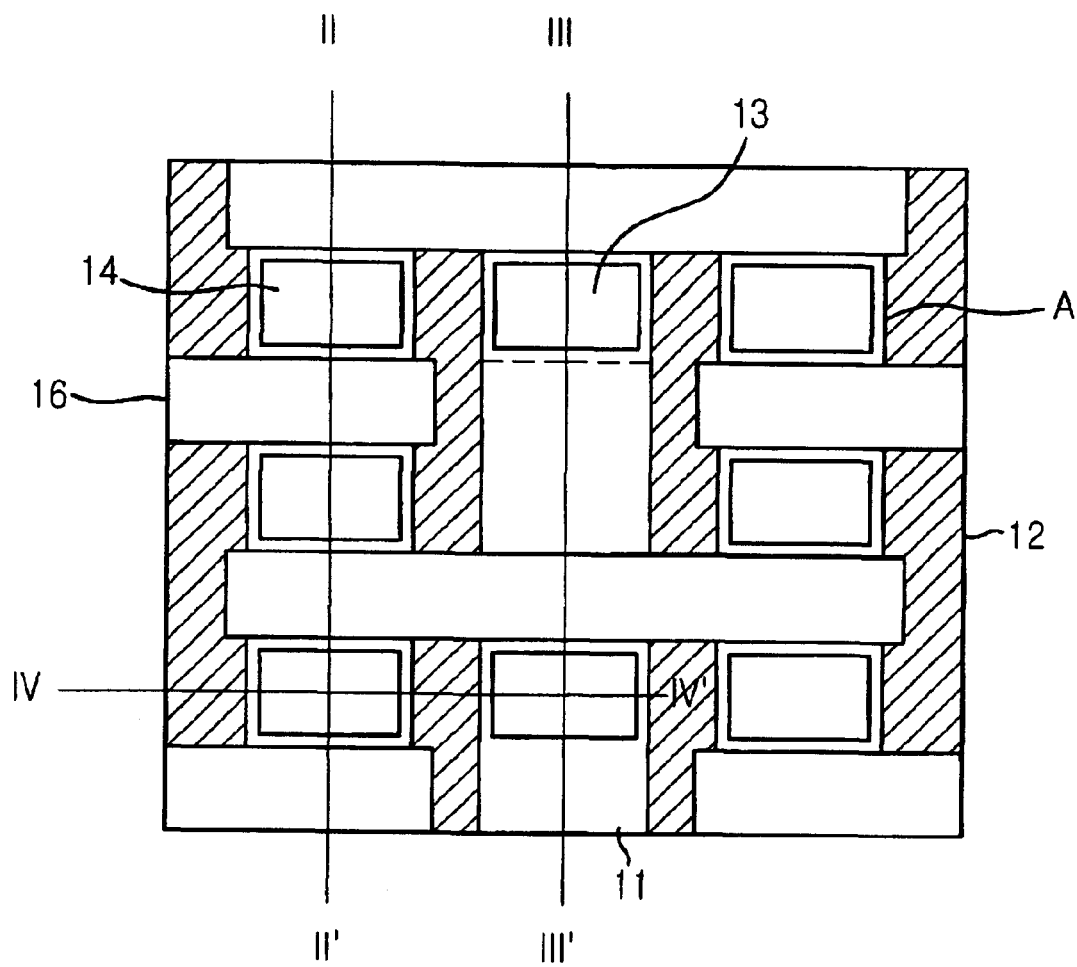
FIG. 1 is a top plan view of a semiconductor device in accordance with a preferred embodiment of the present invention.
Figure 2:
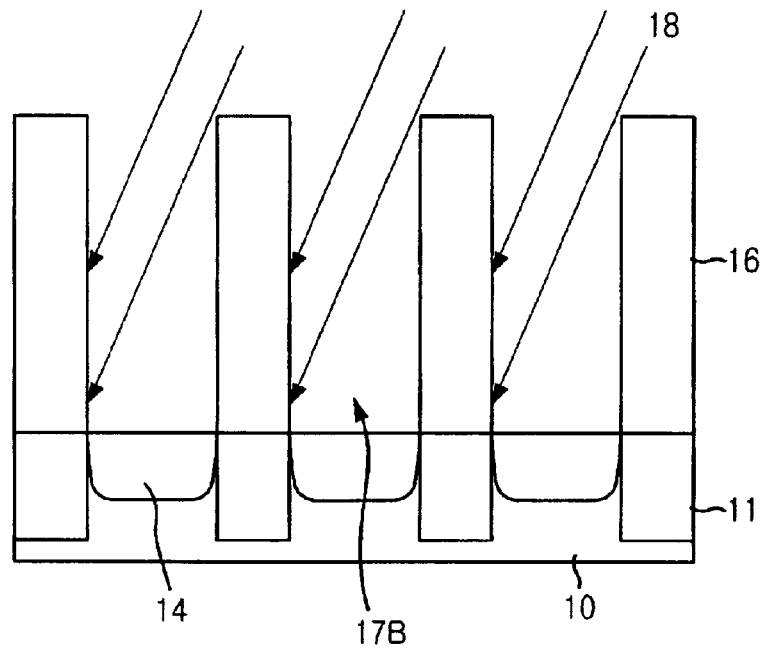
FIG. 2 is a cross-sectional view of the semiconductor device taken by a line II–II' shown in FIG. 1.
Figure 3:
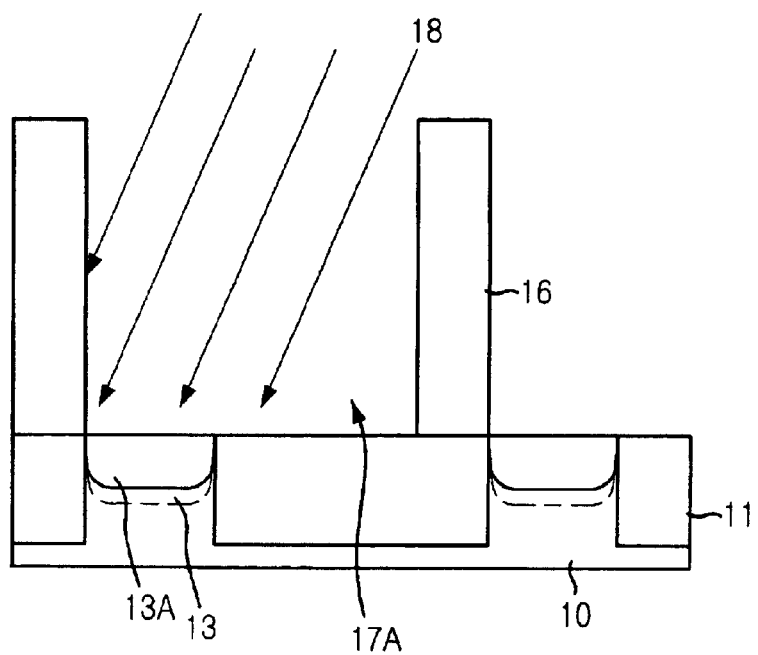
FIG. 3 is a cross-sectional view of the semiconductor device taken by a line III–III' shown in FIG. 1.
Figure 4:
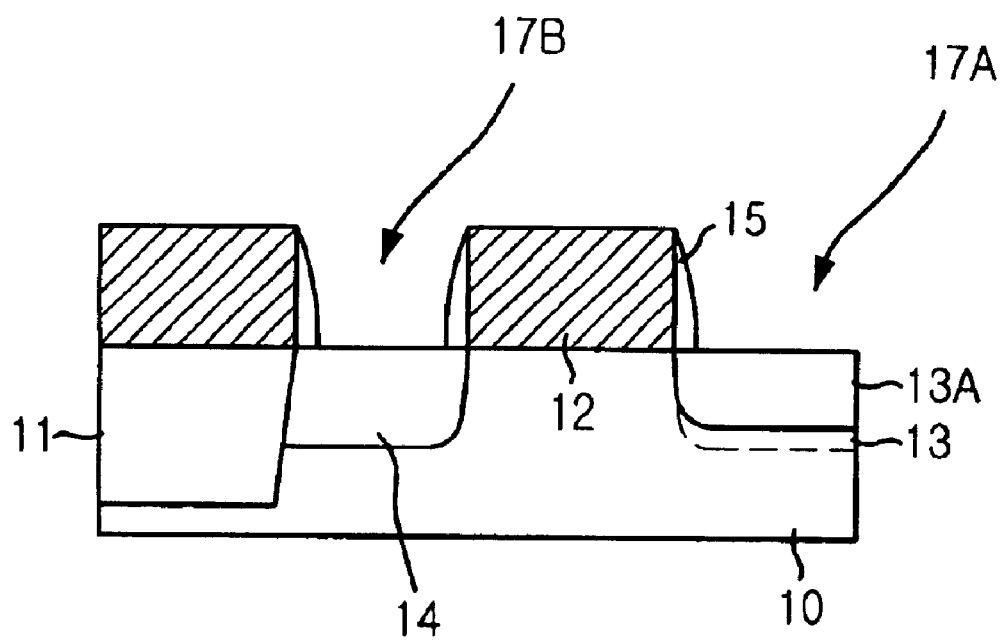
FIG. 4 is a cross-sectional view of the semiconductor device taken by a line IV–IV' shown in FIG. 1.

FIGS. 1 to 4 are a plan and cross-sectional views for describing a method of fabricating a semiconductor device in accordance with a preferred embodiment of the present invention. FIG. 2 is a cross-sectional view of the semiconductor device taken by a line II–II' shown in FIG. 1. FIG. 3 is a cross-sectional view of the semiconductor device across a line III–III' shown in FIG. 1. FIG. 4 is a cross-sectional view of the semiconductor device taken by a line IV–IV' shown in FIG. 1.

Referring to FIGS. 1 to 4, the word line 12 is composed of a hard-mask, a gate, and a gate-insulation layer formed in predetermined intervals on an active area A of a substrate 10 by a device isolation layer. Herein, the hard-mask is made of a nitride layer and the gate is made of a metal/poly-silicon or metal-silicide/poly-silicon lamination layer. Then, a junction between source and drain in the active area A is formed by implanting an N type dopant ion on both sides of the word line 12 of the substrate 10. The source 13 is connected to a bit line and the drain 14 is connected to a storage node of a capacitor.

The isolation layer 16 is formed for separating the semiconductor device at a predetermined interval and perpendicularly crossing the semiconductor device to the word line 12. First and second contact holes 17A and 17B for a landing plug contact LPC for exposing the source 13 and the drain 14 of the transistor are formed. As the isolation layer 16 is more widely arranged in the source 13 of the transistor than in the drain 14 of the transistor, a size of the first contact hole 17A is relatively large because there is opened not only a whole area of the source 13 but also a partial area of the isolation layer 11 adjacent to the source 13.

Using a mask for ion implantation, a tilt ion implantation process is performed in the isolation layer 16 and the word line 12 to implant a P-type dopant ion, e.g., Boron, in a preferred embodiment—in the source 13 of the transistor. The tilt ion implantation process is carried out using a tilt angle of about 20° to about 25° and, preferably, a twist of about 7° to 18°. Also, the tilt ion implantation process is carried out in a direction of the word line 12. Because the interval between the isolation layers 16 is wider in the source 13 of the transistor than in the drain 14 of the transistor, the dopant density of the source 13 is weaker than that of the drain 14 and a doping depth 13A of the source 13 is shallower than that of the drain 14. After the above processes, there are performed processes for forming a landing plug contact LPC, a bit line contact, and a storage node contact.

In the above embodiment, the tilt ion implantation process is carried out by using the isolation layer which is arranged at different intervals on the source and the drain of the transistor so that the punchthough phenomenon between the source 13 and the drain 14 of the transistor is effectively eliminated by reducing the doping depth of the source 13.

Figure 5:
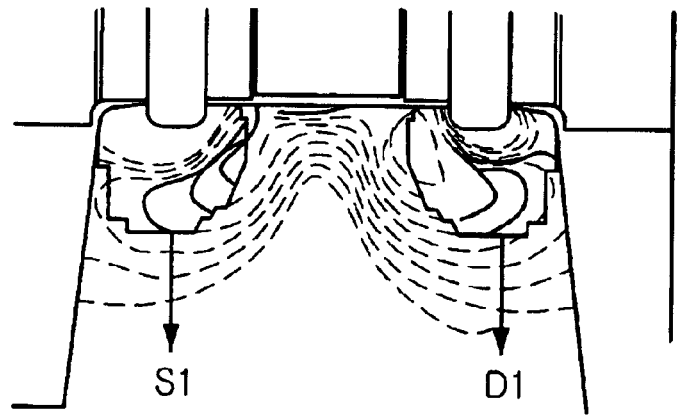
FIG. 5 describes simulation result about junction of source and drain of the transistor in accordance with the prior art.
Figure 6:
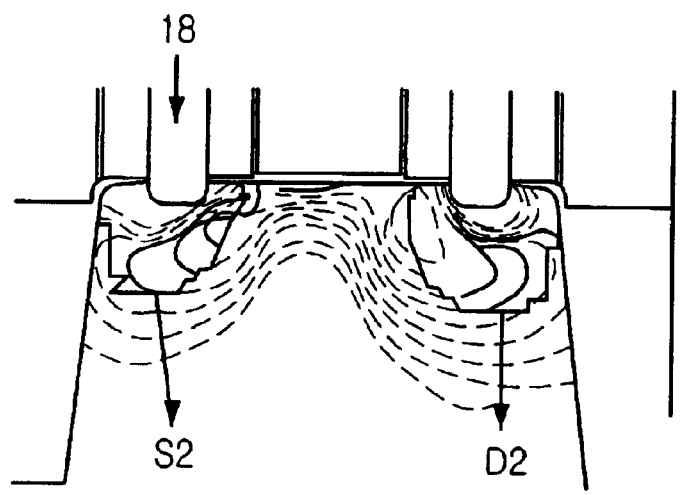
FIG. 6 is an explanatory diagram illustrating a simulation result about junction of source and drain of the transistor contained in a semiconductor device in accordance with the present invention.

FIG. 5 describes simulation results for a junction of source and drain of a transistor contained in a conventional semiconductor device and FIG. 6 describes simulation results for a junction of source and drain of the transistor contained in a semiconductor device in accordance with the present invention.

In the present invention, the P-type dopant is implanted in the source of the transistor by the tilt ion implantation process. As shown in FIGS. 5 and 6, the source S2 of the transistor in accordance with the present invention has a shallower doping depth than does source S1 in accordance with the prior art. Because the source S2 of the transistor has a shallower doping depth, it is difficult to join the source S2 to the drain of the transistor by reducing a junction area of the source S2.

While the present invention has been described with respect to the particular embodiments, it will be apparent to those skilled in the art that various changes and modifications may be made without departing from the spirit and scope of the invention as defined in the following claims.

What is claimed is:

1. A method of fabricating a semiconductor device, comprising:

forming a source and a drain respectively doped with a first conductivity type in each active area on both sides of each word line over a second conductivity type doped substrate, wherein each word line is separated by a predetermined interval;

forming a first contact hole and a second contact hole by using isolation layers which are separated by an interval, which is wider in each source than in each drain, to expose the source and the drain; and selectively implanting a second conductivity type dopant ion in the source by using each isolation layer and each word line as an ion implanting mask during a tilt ion implantation process.

2. The method as recited in claim 1, wherein the tilt ion implantation process is carried out using a tilt angle of about 20° to about 25°.

3. The method as recited in claim 2, wherein the tilt ion implantation process is carried out using the tilt angle of about 7° to about 18°.

4. The method as recited in claim 3, wherein the tilt ion implantation process is carried out in a direction of the word line.

5. The method as recited in claim 1, wherein the first conductivity type is N-type and the second conductivity type is P-type.

6. The method as recited in claim 5, the second conductivity type dopant ion is a Boron.

* * * * *